United States Patent [19]
Clemente

[11] Patent Number: 4,786,826
[45] Date of Patent: Nov. 22, 1988

[54] POWER INTERFACE CIRCUIT WITH CONTROL CHIP POWERED FROM POWER CHIP

[75] Inventor: Stefano Clemente, Rolling Hills Estates, Calif.

[73] Assignee: International Rectifier Corporation, Los Angeles, Calif.

[21] Appl. No.: 830,740

[22] Filed: Feb. 19, 1986

[51] Int. Cl.$^4$ ............................................... H03K 3/01
[52] U.S. Cl. .................................. 307/296 R; 307/297; 307/303
[58] Field of Search ................. 307/296 R, 297, 475, 307/303, 318

[56] References Cited

U.S. PATENT DOCUMENTS

| | | | |
|---|---|---|---|
| 3,293,498 | 12/1966 | Baude | 307/296 |
| 3,817,797 | 6/1974 | Langdon | 148/175 |
| 3,829,717 | 8/1974 | Harrison | 307/318 |
| 4,030,024 | 6/1977 | Chambers et al. | 323/17 |
| 4,356,412 | 10/1982 | Moench et al. | 307/296 R |
| 4,420,700 | 12/1983 | Fay et al. | 307/571 |
| 4,451,778 | 5/1984 | Fischer et al. | 323/282 |
| 4,511,815 | 4/1985 | Wood | 307/584 |
| 4,570,216 | 2/1986 | Chan | 307/140 |
| 4,581,694 | 4/1986 | Adams | 323/97 |
| 4,617,509 | 10/1986 | Tomisawa | 323/303 |
| 4,639,661 | 1/1987 | Williams et al. | 323/317 |

OTHER PUBLICATIONS

J. Shepard, "On Chip Logic, Power Opens New Avnues for Applications", Electronic Engineering Times—Sep. 24, 1984—Issue 298—pp. 63, 64, 68 and 70.

*Primary Examiner*—Stanley D. Miller
*Assistant Examiner*—Trong Quang Phan
*Attorney, Agent, or Firm*—Ostrolenk, Faber, Gerb & Soffen

[57] ABSTRACT

A power interface circuit includes a low voltage control chip and a separate, high voltage power chip contained in a common package. The high voltage power chip includes a power switching semiconductor device, such as a thyristor or power MOSFET, and is controlled under the influence of the control chip. Operating power for the low voltage control chip is provided from an auxiliary portion of the high voltage power chip. Such auxiliary portion comprises a voltage regulator, which derives its power from a high voltage lead in the power device. The high voltage lead may comprise a lead on which high voltage power is supplied for power switching purposes. The low voltage control chip may include a high degree of "intelligence", or logic functions, for controlling the power switching device, since the low voltage device may be a microprocessor or other device that can be fabricated with a high density of control elements.

26 Claims, 2 Drawing Sheets

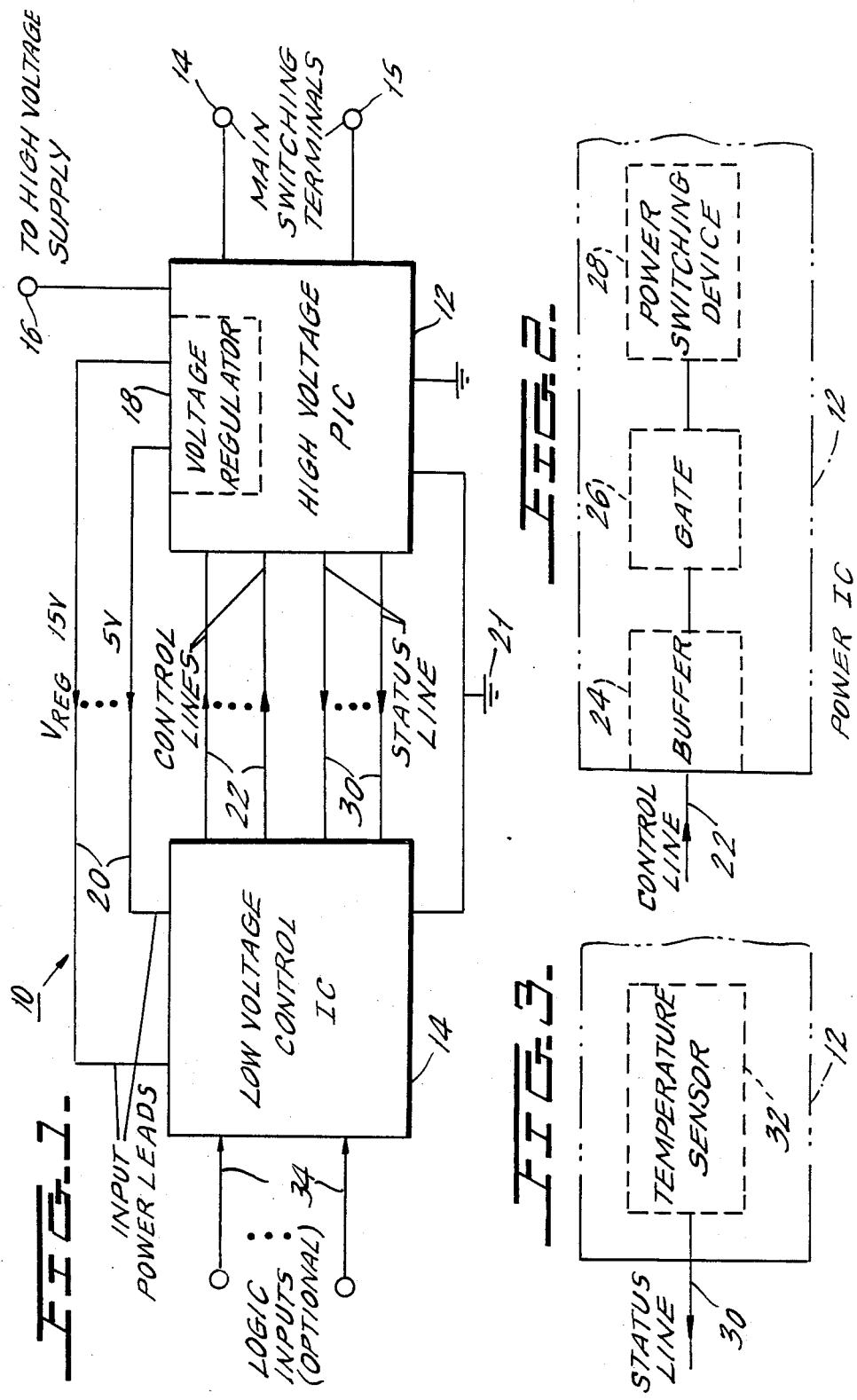

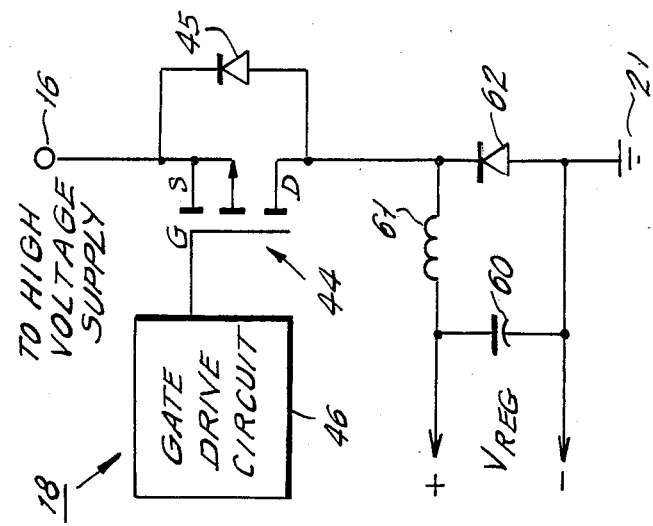
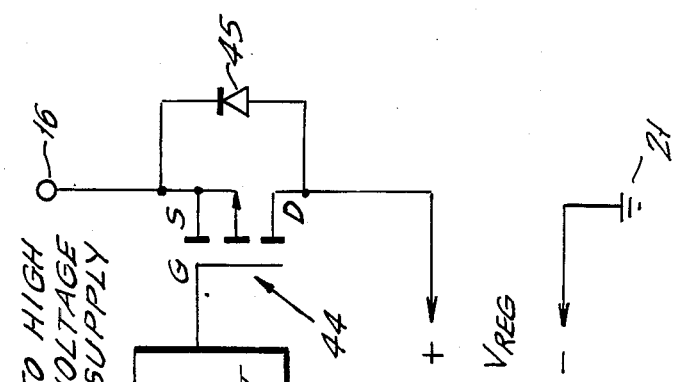
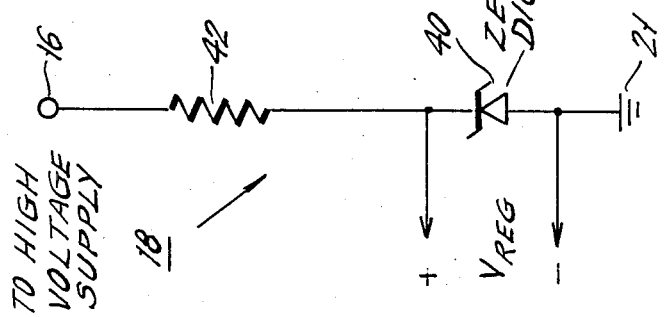

POWER INTERFACE CIRCUIT WITH CONTROL CHIP POWERED FROM POWER CHIP

BACKGROUND AND SUMMARY OF THE INVENTION

The present invention relates to a semiconductor switching device, and its control circuitry for controllably supplying high voltage power to an electric load. More particularly, the invention relates to a power interface circuit in which low voltage control circuitry is located off the power chip but is powered from a voltage regulator contained within the power chip.

Conventional power interface circuits ("PIC's") are useful for applying high voltage power to an electrical load in a controllable manner. Such PIC's are shown in pending application Ser. No. 555,025, filed Nov. 25, 1983, and in pending application Ser. No. 581,785, filed Feb. 21, 1984, each assigned to the assignee of the present invention. These devices are commercially marketed under the trade names "ChipSwitch" and "PVR" respectively, by the assignee of the present application.

Power interface circuits include a control terminal, such as the "gate" of a thyristor, or the "base" of a power bipolar transistor. Control circuits of various forms have been proposed to provide switching signals on the control terminals of switching devices. The control circuits may also provide various forms of power conditioning, such as increasing the duty cycle of supplied power from no load to full load in a gradual manner, controlling zero cross firing, suppressing firing due to voltage surges and the like.

A conventional approach to implementing a PIC has been to integrate both a power switching structure and its associated control circuitry in the same chip body. PIC devices of this sort are sometimes referred to as "smart" power IC's, due to the inclusion of often sophisticated control circuitry in the power chip.

At the present time the amount of intelligence that can be integrated into one power device is limited for reasons to be stated hereinafter. This invention provides a technique whereby a significant amount of intelligence can be incorporated into a PIC by means of well established and inexpensive methods.

The voltage withstanding capability of a power switch, integrated or not, is one of its most important features. This is particularly true in noisy environments, such as encountered in industrial and automotive applications, where voltage transients are quite common. In a monolithic PIC all the intelligence and control functions either must have the same voltage withstanding capability as the power switching unit, or else special buffering and isolation techniques must be used to effectively shield such control functions from the high voltage part of the die. These techniques increase the die size and processing costs.

Since this withstanding voltage is normally greater than 30 or 40V, the traditional, well established and inexpensive manufacturing techniques that are normally employed to build circuits and microprocessors cannot be used for an "intelligent" PIC. Other fabrication techniques have to be used which require large amounts of silicon die area to integrate the most basic functions. These techniques have an intrinsically low yield. This, in turn limits the amount of intelligence that can be made part of the power switch.

SUMMARY OF THE INVENTION

Accordingly, it is an object of the present invention to provide a power switch in which a high degree of intelligence can be incorporated at low cost.

A further object of the invention is to provide a power switch that can be fabricated with well-established manufacturing techniques that have a high fabrication yield.

Another object is to provide a power switch utilizing a minimum amount of overall chip area while containing control circuitry with a high degree of intelligence.

In accordance with the invention, a PIC is provided consisting of a low voltage control chip and a high voltage power chip in the same package and preferably, on the same mounting substrate or lead frame. The chips are fabricated separately from each other. The high voltage power chip includes a gatable power switching device for switchably supplying high voltage power to an electric load. "High voltage" as used herein means voltages considerably in excess of about 5 volts, which is the voltage conventionally used to drive a microprocessor chip. The high voltage is of a magnitude conventionally employed in homes and factories and could be 120 volts or 220 volts a.c., for example.

Included within the power chip of the invention is a means for generating regulated low voltage from the high voltage that is impressed across the power chip. "Low voltage" as used herein means the voltage commonly used to power microprocessor chips, typically 5 bolts d.c. Further means are provided for applying the regulated low voltage to an input power lead of the control chip. Accordingly, the low voltage control chip is powered from the high voltage power chip. Means are also provided to connect an output control lead of the control chip to the power switching device.

The PIC of the invention may incorporate a high degree of "intelligence", since the low voltage control chip may be fabricated with high density fabrication techniques. The low voltage control chip may comprise an off-the-shelf microprocessor chip or other device that may be fabricated using well-established techniques. The overall cost of the PIC is low because the low voltage control device need not be fabricated with high voltage withstanding capability or else be specially buffered by isolation techniques from the high voltage part of the PIC, as in prior art PIC's.

BRIEF DESCRIPTION OF THE DRAWINGS

Other objects and features of the invention will become apparent from the following description of the preferred embodiments of the invention considered in conjunction with the accompanying drawings in which:

FIG. 1 is a block diagram of a PIC in accordance with the present invention.

FIG. 2 is a block diagram of the various devices contained within the high voltage power chip shown in the power switch of FIG. 1.

FIG. 3 is a view similar to FIG. 2 illustrating a further device that may be included within the power chip shown in FIG. 1.

FIGS. 4A–4C are circuit schematics of various voltage regulators that may be incorporated into the power chip of FIG. 1.

DESCRIPTION OF THE PREFERRED EMBODIMENTS

Referring now to the drawings wherein like numerals indicate like elements, there is shown in FIG. 1 a power interface circuit ("PIC") PIC 10 in accordance with the present invention. PIC 10 includes a high voltage power IC or chip 12 and a low voltage control IC 14. IC's 12 and 14 may be mounted on a common substrate or in different packages. The power IC 12 includes a power switching device such as an integral bipolar transistor, thyristor or MOSFET switching device (not shown) capable of switchably supplying power to a pair of main switching terminals 14, 15 from a high voltage power supply (not shown) that impresses a high voltage on a high voltage line 16.

Included within power chip 12 is a voltage regulator 18 that is capable of producing one or more regulated low voltages derived from the high voltage on line 16, for example. The regulated voltage, $V_{REG}$, is applied to input power leads 20 of the low voltage control IC 14 for supplying operating power to the control IC. The regulated voltage may be at 5 or 15 volts, by way of example, depending upon the power voltage requirements of the control IC 14. The voltage regulator 18 may be implemented in a variety of forms, several of which are discussed in detail hereinafter.

The control IC 14 includes one or more control output lines 22 which are connected to the power chip 12. As depicted in the detail view of FIG. 2, a signal on a control line 22 is processed by a buffer 24 before being applied to a gate 26 of the power switching 28. The devices 24, 26 and 28 are shown in dashed lines for clarity of illustration. The buffer 24 may be a high input impedance device, for example, that prevents power chip 12 from exerting influence on the signal present on control line 22. The power switching device 28 may comprise, for example, a thyristor, a power bipolar transistor, or a power metal-oxide-semiconductor field-effect transistor (MOSFET). One device which can be used for the power switching device 28 is the bidirectional output semiconductor field-effect transistor (BOSFET), which is disclosed and claimed in copending U.S. patent application Ser. No. 581,785, filed on Feb. 21, 1985 and assigned to the present assignee. The control terminal 26 of the power switching device 28 is referred to herein as a "gate", but is intended to be broadly construed so as to be synonymous with the "base" of a power bipolar transistor, for example.

Referring again to FIG. 1, one or more status lines 30 may be provided between the power chip 12 and the control IC 14. The status lines 30 contain information relating to conditions of the power chip 12, such as temperature. The control IC 14, in response to the information on status lines 30, reacts to the status information and determines appropriate control information to be provided to the power chip on the control output lines 22. With reference to FIG. 3, for example, if a temperature sensor 32 in the power chip 12 senses that the power chip is rising in temperature towards a level greater than a given value, the control IC 14 might react by reducing the duty cycle of the power switching device 28 in the power chip 12.

In FIG. 1, the low voltage control IC 14 may include one or more logic inputs 34. In this manner, the control IC 14 may receive command signals from an external source (not shown), so that the overall power switch 10 is responsive to such external source. The low voltage control IC 14 may comprise a low cost microprocessor chip or a very large scale integrated (VLSI) chip, by way of example. These devices can be made with well-established fabrication techniques that provide a high density of control elements, for increased "intelligence", and a high fabrication yield, for low cost. Preferably, the chips 12 and 14 are contained in a common package. One or more power chips 12 or control chips 14 can be contained in a common chip. Significantly, the chips 12 and 14 are isolated from one another so that the high voltage of chip 12 is not applied to the low voltage chip 14.

The voltage regulator 18 of the high voltage power chip 12 derives its power from the high voltage line 16, for example, as mentioned above. The high voltage power may be supplied by another line or pin of IC 12, which can be at the same potential as line 16. Preferred circuit implementations for the voltage regulator 18 are illustrated in FIGS. 4A, 4B and 4C. The circuits of FIGS. 4A-4C are intended to be contained integrally within high voltage power chip 12, except, perhaps, for inductive or capacitive elements that may be more conveniently implemented by discrete devices contained within or without the common package for chip 12 or 14.

In FIG. 4A, a voltage regulator 18 is implemented by a Zener diode 40 which is conventionally integrated into a small surface area of chip 12. The diode 40 has its cathode connected to the high voltage line 16 via a current-limiting resistor 42, and its anode connected to the reference node 21. Resistor 42 may also be integrated into the chip 12 as shown in aforementioned, copending application Ser. No. 581,785. Current flow through the Zener diode 40 from the supply line 16 produces a constant or regulated voltage $V_{REG}$ at the Zener breakdown voltage of the diode. This voltage $V_{REG}$ which may be 5 volts or 15 volts, depending on the required control voltage of chip 14, is applied to chip 14 over lines 22 of FIG. 2.

In FIG. 4B, a regulated voltage $V_{REG}$ is provided at the drain D of a p-channel MOSFET 44. The source S of the MOSFET 44 is connected to the high voltage line 16. A diode 45 is connected across MOSFET 44 with its cathode shorted to source S and its anode shorted to drain D. The gate G of the MOSFET 44 is controlled by a gate drive circuit 46 which may control the current in MOSFET 44, from logic circuits on the remote logic chip, to maintain a constant voltage $V_{REG}$. The gate drive control circuit and MOSFET 44 are on the main power chip.

In FIG. 4C, there are added to the circuit of FIG. 4B a filter capacitor 60, filter choke 61, and diode 62. The output voltage $V_{REG}$ is taken from across the capacitor 60. Diode 62 may be integrated into the power chip.

The voltage regulator circuits of FIGS. 4A, 4B and 4C are intended to be incorporated into the high voltage power IC 12 with the possible exceptions of the inductor 61 and the capacitor 60, which may be implemented as discrete devices if desired.

The power switch 10 of FIG. 1 realizes many advantages over the prior art approach of incorporating "intelligence" or control circuitry into the power chip. By having voltage regulator 18 in the power chip 12 provide operating power for the separate, low voltage control IC 14, the overall cost of the switch 10 can be minimized, while the degree of "intelligence" provided by the low voltage control IC 14 can be maximized. This is because the low voltage control IC 14 can be fabricated with well developed techniques which have a high fabrication yield and result in low device cost. A considerably greater amount of intelligence for a given chip area can be provided in the control IC 14 than is possible where the control circuitry is incorporated into the high voltage power chip 12. This is because control circuitry, when incorporated into a high voltage device, has a low density of circuit elements due to the need to provide voltage withstanding capability or to allow large areas in the die to buffer and isolate the low voltage circuitry. The present invention accordingly provides a power chip having significantly more control function capability for a considerably lower cost than conventional power chips.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

What is claimed is:

1. A power interface circuit, comprising:
   (a) a low voltage control chip having an input lead on which power to operate the chip is supplied and an output lead;
   (b) a high voltage power chip separate from said low voltage control chip and including a power switching device, with a control lead, for supplying power to an electrical load, said high voltage power chip integrally including a conductor on which high voltage is applied and a means for deriving a regulated voltage from said high voltage which is applied to said conductor;
   (c) means for applying said regulated voltage to said input lead of said low voltage control chip so that the low voltage control chip is powered from the high voltage power chip; and
   (d) means to couple said output lead to said control lead of said power switching device, whereby the high voltage switching device is controllable by said low voltage control chip.

2. The power interface circuit of claim 1, wherein:
   (a) said high voltage power chip integrally includes a status circuit for measuring a status condition of said power switching device; and
   (b) said low voltage control chip includes input means for receiving status information from said status circuit and control means for reacting to said status information and determining control information on said output lead.

3. The power interface circuit of claim 1, wherein said means for providing regulated voltage comprises a Zener diode, said diode being connected to a lead in said power chip on which high voltage is supplied.

4. The power interface circuit of claim 1, wherein said means for providing regulated voltage comprises a switching device connected between a lead in said chip on which high voltage is supplied and said input power lead.

5. The power interface circuit of claim 1, wherein said low voltage control chip is a digital logic device.

6. The power interface of claim 1, wherein said low voltage control chip is a VLSI chip.

7. A power switch, comprising:
   a high voltage power chip for receiving a source voltage and supplying a voltage to a load as a function of a control signal applied to said line, said high voltage power chip also deriving from said source voltage a regulated output voltage which is significantly lower than said load voltage; and
   a low voltage control chip which is powered by said regulated output voltage and which generates said control signal for said power chip, said control chip being separate from said power chip.

8. The power switch of claim 7, wherein said low voltage control chip is a microprocessor.

9. The power switch of claim 7, wherein said low voltage control chip is a VLSI chip.

10. In a power interface circuit for switchably applying power from a voltage source to an electrical load in a controllable manner, said circuit including a power switching device contained in a power chip and having a gate terminal, the improvement comprising, in combination with the foregoing;
    a control chip separate from said power chip and providing a control signal on an output lead;
    means for receiving said control signal and transferring a corresponding signal to said gate terminal for controlling the switching state of the power switching device; and
    said power chip including an auxiliary region deriving a regulated voltage from said voltage source for powering said control chip.

11. The power interface circuit of claim 10, wherein:
    (a) said power chip integrally includes a status circuit for measuring a status condition of said power switching device; and
    (b) said control chip includes input means for receiving status information from said status circuit and control means for reacting to said status information and determining control information on said output control lead.

12. The power interface circuit of claim 10, wherein said low voltage control chip is a digital logic device.

13. The power interface circuit of claim 10, wherein said low voltage control chip is a VLSI chip.

14. A power interface circuit, comprising:
    (a) a control chip having an input lead on which power to operate the chip is supplied and an output lead;
    (b) a power chip separate from said control chip and including a power switching device having a control lead and being for supplying power to an electrical load from a source voltage, said power chip integrally including a conductor on which said source voltage is applied and a means for deriving a regulated voltage from said source voltage;
    (c) means for applying said regulated voltage to said input lead of said control chip so that the control chip is powered from the power chip; and
    (d) means to couple said output lead to said control lead of said power switching device whereby the switching device is controllable by said control chip.

15. The power interface circuit of claim 14, wherein:
    (a) said power chip integrally includes a status circuit for measuring a status condition of said power switching device; and
    (b) said control chip includes input means for receiving status information from said status circuit and control means for reacting to said status information and determining control information on said output lead.

16. The power interface circuit of claim 14, wherein said means for providing regulated voltage comprises a Zener diode, said diode being connected to a lead in said power chip on which a voltage is supplied.

17. The power surface circuit of claim 14, wherein said means for providing regulated voltage comprises a switching device connected between a lead in said power chip on which a voltage is supplied and said input lead.

18. The power interface circuit of claim 14, wherein said control chip is a digital logic device.

19. The power interface circuit of claim 14, wherein said control chip is a VLSI chip.

20. A power switch, comprising:
   a power chip for receiving a source voltage and supplying a voltage to a load as a function of a control signal applied thereto, said power chip also deriving from said source voltage a regulated output voltage which is lower than said load voltage; and
   a control chip which is powered by said regulated output voltage and which generates said control signal for said power chip, said control chip being separate from said power chip.

21. The power switch of claim 20, wherein said control chip is a microprocessor.

22. The power switch of claim 20, wherein said control chip is a VLSI chip.

23. In a power interface circuit for switchably applying power from a voltage source to an electrical load in a controllable manner; said circuit including a power switching device contained in a power chip and having a gate terminal, the improvement comprising, in combination with the foregoing;
   a control chip separate from said power chip and providing a control signal on an output lead;
   means for receiving said control signal and transferring a corresponding signal to said gate terminal for controlling the switching state of the power switching device; and
   said power chip including an auxiliary region deriving a regulated voltage from said voltage source for powering said control chip.

24. The power interface circuit of claim 23, wherein:
   (a) said power chip integrally includes a status circuit for measuring a status condition of said power switching device; and
   (b) said control chip includes input means for receiving status information from said status circuit and control means for reacting to said status information and determining control information on said output control lead.

25. The power interface circuit of claim 23, wherein said control chip is a digital logic device.

26. The power interface circuit of claim 23, wherein said control chip is a VLSI chip.

* * * * *